United States Patent
Han et al.

(10) Patent No.: US 10,991,439 B2
(45) Date of Patent: Apr. 27, 2021

(54) MEMORY DEVICE AND AN OPERATING METHOD OF A MEMORY DEVICE

(71) Applicant: SK hynix Inc., Icheon-si (KR)

(72) Inventors: Yong Han, Seoul (KR); Jun Hyuk Lee, Cheongju-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/085,823

(22) Filed: Oct. 30, 2020

(65) Prior Publication Data
US 2021/0050066 A1 Feb. 18, 2021

Related U.S. Application Data

(63) Continuation of application No. 16/418,509, filed on May 21, 2019, now Pat. No. 10,861,570.

(30) Foreign Application Priority Data

Oct. 8, 2018 (KR) .................. 10-2018-0119739

(51) Int. Cl.
*G11C 16/06* (2006.01)
*G11C 16/34* (2006.01)
*G11C 16/16* (2006.01)
*G11C 16/30* (2006.01)
*G11C 16/26* (2006.01)
*G11C 16/08* (2006.01)

(52) U.S. Cl.
CPC .......... *G11C 16/3445* (2013.01); *G11C 16/08* (2013.01); *G11C 16/16* (2013.01); *G11C 16/26* (2013.01); *G11C 16/30* (2013.01)

(58) Field of Classification Search
CPC ..... G11C 16/3445; G11C 16/30; G11C 16/26; G11C 16/16; G11C 16/08
See application file for complete search history.

(56) References Cited

U.S. PATENT DOCUMENTS

| 4,996,571 | A | 2/1991 | Kume et al. | |
|---|---|---|---|---|
| 2002/0008996 | A1* | 1/2002 | Hirano | ................. G11C 16/344 365/185.33 |
| 2008/0037307 | A1 | 2/2008 | Goda | |
| 2016/0276033 | A1* | 9/2016 | Cha | ...................... G11C 16/349 |
| 2017/0140829 | A1* | 5/2017 | Park | ................... G11C 16/3459 |

FOREIGN PATENT DOCUMENTS

| KR | 1020080056970 A | 6/2008 |
|---|---|---|
| KR | 101198515 B1 | 11/2012 |

\* cited by examiner

*Primary Examiner* — Uyen Smet
(74) *Attorney, Agent, or Firm* — William Park & Associates Ltd.

(57) ABSTRACT

A memory device and an operating method of the memory device is disclosed. The memory device includes a memory cell array including a plurality of memory blocks. The memory device further includes a peripheral circuit for performing an erase voltage application operation, a first erase verify operation, and a second erase verify operation on a selected memory block among the plurality of memory blocks. The memory device also includes a control logic for setting a start erase voltage of an erase operation, based on a result of the first erase verify operation, and controlling the peripheral circuit to perform the second erase verify operation when it is determined that the first erase verify operation on the selected memory block has been passed.

6 Claims, 10 Drawing Sheets

MEMORY DEVICE AND AN OPERATING METHOD OF A MEMORY DEVICE

CROSS-REFERENCE TO RELATED APPLICATION

The present application is a continuation application of U.S. patent application Ser. No. 16/418,509, filed on May 21, 2019, and claims priority under 35 U.S.C. § 119(a) to Korean patent application number 10-2018-0119739, filed on Oct. 8, 2018, in the Korean Intellectual Property Office, the entire disclosure of which is incorporated herein by reference.

BACKGROUND

1. Technical Field

The present disclosure generally relates to an electronic device, and more particularly, to a memory device and an operating method of the memory device.

2. Related Art

Among semiconductor devices, memory devices are generally classified into volatile memory devices and nonvolatile memory devices.

Nonvolatile memory devices have relatively slow write and read speeds as compared to volatile memory devices but retain stored data even when the supply of power is interrupted. Thus, nonvolatile memory devices are used to store data intended to be retained regardless of whether power is supplied.

Examples of nonvolatile memory devices include Read Only Memory (ROM), Mask ROM (MROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory is classified into NOR type flash memory and NAND type flash memory.

Flash memory has advantages of both RAM, to and from which data is freely programmed and erased, and ROM, which is capable of preserving stored data even when the supply of power is interrupted. Flash memory has been widely used as storage media for portable electronic devices, such as digital cameras, Personal Digital Assistant (PDAs), and MP3 players.

SUMMARY

Various embodiments provide a memory device capable of improving a threshold voltage distribution of memory cells in an erase operation of the memory device and an operating system of the memory device.

In accordance with the present disclosure, a memory device includes a memory cell array including a plurality of memory blocks. The memory device further includes a peripheral circuit configured to perform an erase voltage application operation, a first erase verify operation, and a second erase verify operation on a selected memory block among the plurality of memory blocks. The memory device also includes a control logic configured to set a start erase voltage of an erase operation, based on a result of the first erase verify operation, and control the peripheral circuit to perform the second erase verify operation when it is determined that the first erase verify operation on the selected memory block has been passed.

Also in accordance with the present disclosure, a memory device includes a memory cell array including a plurality of memory blocks. The memory device further includes a peripheral circuit configured to perform an erase voltage application operation, a first erase verify operation, a second erase verify operation, and a soft program operation on a selected memory block among the plurality of memory blocks. The memory device also includes a control logic configured to set a start erase voltage of an erase operation, based on a result of the first erase verify operation, and to control the peripheral circuit to perform the soft program operation, based on a result of the second erase verify operation.

Further in accordance with the present disclosure, a method for operating a memory device includes programming dummy data in memory cells included in a memory block and performing an erase voltage application operation of erasing the memory cells by applying an erase voltage to a source line of the memory block. The method also includes performing a first erase verify operation of determining whether a threshold voltage of the memory cells is lower than a first erase verify voltage. When it is determined that the first erase verify operation of the memory blocks has been failed, the method includes resetting the erase voltage by increasing the erase voltage by a step voltage and again performing the first erase verify operation. When it is determined that the first erase verify operation of the memory blocks has been passed, the method includes performing a second erase verify operation of determining whether the threshold voltage of the memory cells is higher than a second erase verify voltage. When it is determined that the second erase verify operation of the memory cells has been failed, the method includes performing a soft program operation on the memory block and then again performing the second erase verify operation. When it is determined that the second erase verify operation of the memory cells has been passed, the method includes setting a last reset erase voltage as a start erase voltage.

BRIEF DESCRIPTION OF THE DRAWINGS

Example embodiments are described herein with reference to the accompanying drawings. However, these embodiments may be embodied in different forms from those presented and should thus not be construed as being limited to the presented forms. A limited number of possible embodiments are provided so that this disclosure will be enabling for those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
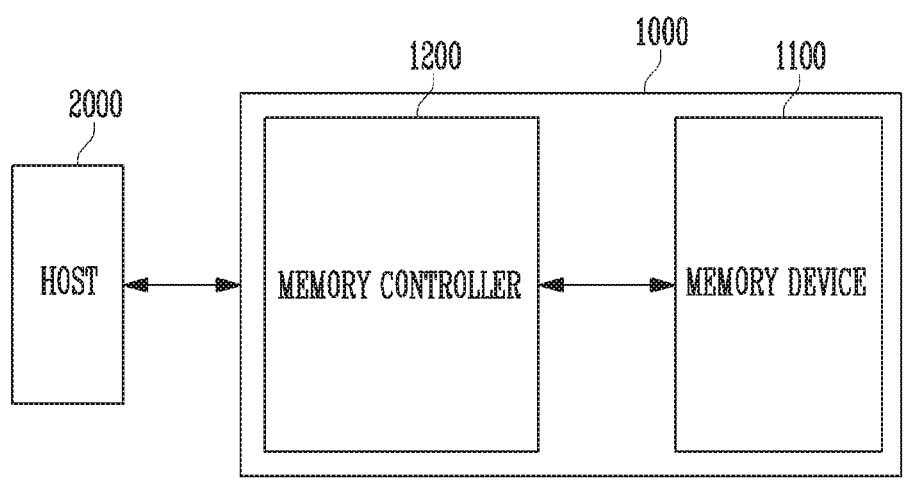
FIG. 1 shows a diagram illustrating a memory system, according to an embodiment of the present disclosure.

The specific structural and functional descriptions disclosed herein are illustrative for the purpose of describing embodiments according to the present teachings. The embodiments according to the present teachings can be implemented in various forms. Therefore, the present teachings are not limited by the described embodiments.

Presented embodiments according to the presented teachings can be variously modified and have various shapes. Embodiments illustrated in the drawings are described herein in detail. However, the described embodiments do not limit the present disclosure. The present disclosure includes all changes, equivalents, or substitutions of presented embodiments that do not depart from the spirit and technical scope of the claims provided below.

While terms such as "first" and "second" may be used to describe various components, such components are not limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing embodiments, descriptions will be omitted for techniques that are well known in the art to which the present disclosure pertains, and are not directly related to the present disclosure. This intends to disclose the gist of the present disclosure more clearly by omitting unnecessary descriptions.

Hereinafter, embodiments of the present disclosure are described in detail with reference to the accompanying drawings in order for those skilled in the art to be able to readily implement the technical spirit of the present disclosure.

FIG. 1 shows a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol, such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-indicated examples, and may be one of other interface protocols such as a Universal Serial Bus (USB), a Multi-Media Card (MMC), an Enhanced Small Disk Interface (ESDI), and Integrated Drive Electronics (IDE).

The memory controller 1200 may control the overall operations of the memory system 1000 and control data exchanges between the host 2000 and the memory device 1100. For example, the memory controller 1200 may program, read, or erase data by controlling the memory device 1100 in response to a request from the host 2000. In some embodiments, the memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and/or a flash memory.

The memory device 1100 may perform a program, read, or erase operation under the control of the memory controller 1200.

Figure 2:
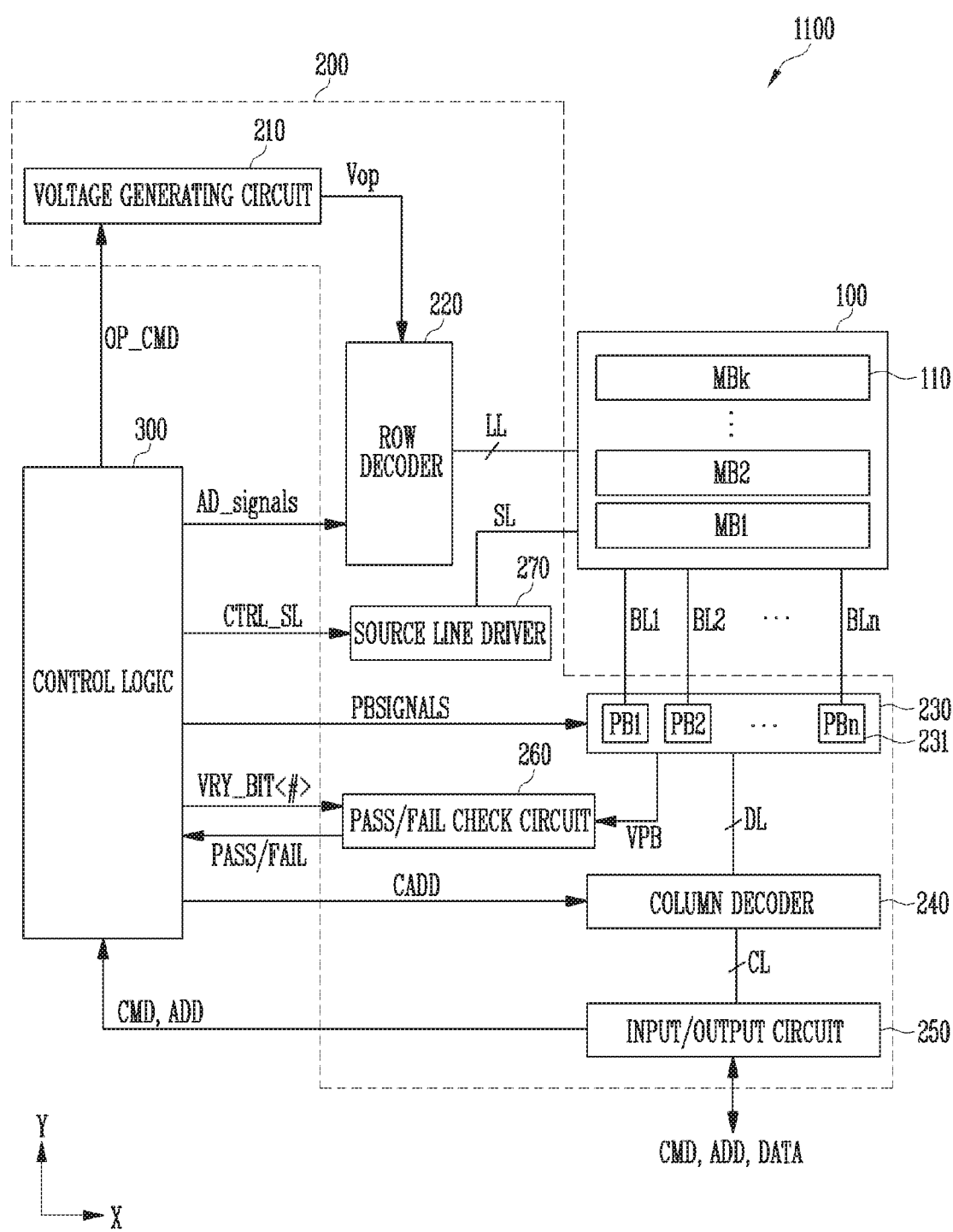
FIG. 2 shows a diagram illustrating a memory device of FIG. 1.

FIG. 2 shows a diagram illustrating the memory device 1100 of FIG. 1.

Referring to FIG. 2, the memory device 1100 may include a memory cell array 100 that stores data. The memory device 1100 may include a peripheral circuit 200 configured to perform a program operation for storing data in the memory cell array 100, a read operation for outputting the stored data, and an erase operation for erasing the stored data. The memory device 1100 may include a control logic 300 that controls the peripheral circuit 200 under the control of the memory controller 1200 of FIG. 1. The control logic may be implemented in hardware, software, or a combination thereof. For example, the control logic may be realized as a control logic circuit operating in accordance with an algorithm, The memory cell array 100 may include a plurality of memory blocks MB1 to MBk (k is a positive integer) 110. Local lines LL and bit lines BL1 to BLn (n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuit 200 may be configured to perform program, read, and erase operations of a selected memory block 110 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, verify voltages, pass voltages, a turn-on voltage, a read voltage, and the like under the control of the control logic 300.

The row decoder 220 may transfer the operating voltages Vop to the local lines LL coupled to the selected memory block 110 in response to row decoder control signals AD_signals.

The page buffer group 230 may include a plurality of page buffers PB1 to PBn 231 coupled to the bit lines BL1 to BLn, respectively. The page buffers PB1 to PBn 231 may operate in response to page buffer control signals PBSIGNALS. For example, the page buffers PB1 to PBn 231 may temporarily store data received through the bit lines BL1 to BLn, or sense voltages or currents of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller 1200 of FIG. 1, to the control logic 300, or exchange data DATA with the column decoder 240.

In a read operation and a verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control a voltage applied to the source line SL. In an example, the source line driver 270 may electrically couple the source line SL and a ground node in a program, read, or verify operation. Also, the source line driver 270 may apply an erase voltage to the source line SL in an erase operation. The source line driver 270 may receive a source line control signal CTRL_SL from the control logic 300, and couple the ground node to the source line SL or apply the erase voltage to the source line SL, based on the source line control signal CTRL_SL. Also, the source line driver 270 may adjust the potential level of the erase voltage, based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#>in response to the command CMD and the address ADD. Also, the control logic 300 may determine whether the verify operation has passed or failed in response to the pass or fail signal PASS or FAIL.

The control logic 300 may control the peripheral circuit 200 to perform an erase voltage setting operation for optimizing and setting an erase voltage used in an erase operation of the memory device 1100. The erase voltage setting operation may include an erase voltage application operation for applying an initially set erase voltage, a first erase verify operation using a first erase verify voltage, a second erase verify operation using a second erase verify voltage lower than the first erase verify voltage when it is determined that the first erase verify operation on memory cells has passed as a result of the first erase verify operation, and a soft program operation on memory cells of which second erase verify operation has failed as a result of the second erase verify operation. In the erase voltage setting operation, an erase voltage used in the erase operation may be set by increasing or decreasing the erase voltage, based on the result of the first erase verify operation and the second erase verify operation. Also, the control logic 300 may control the voltage generating circuit 210 to generate a program voltage by varying a step voltage value according to position information (word line address) of memory cells in a soft program operation.

Figure 3:
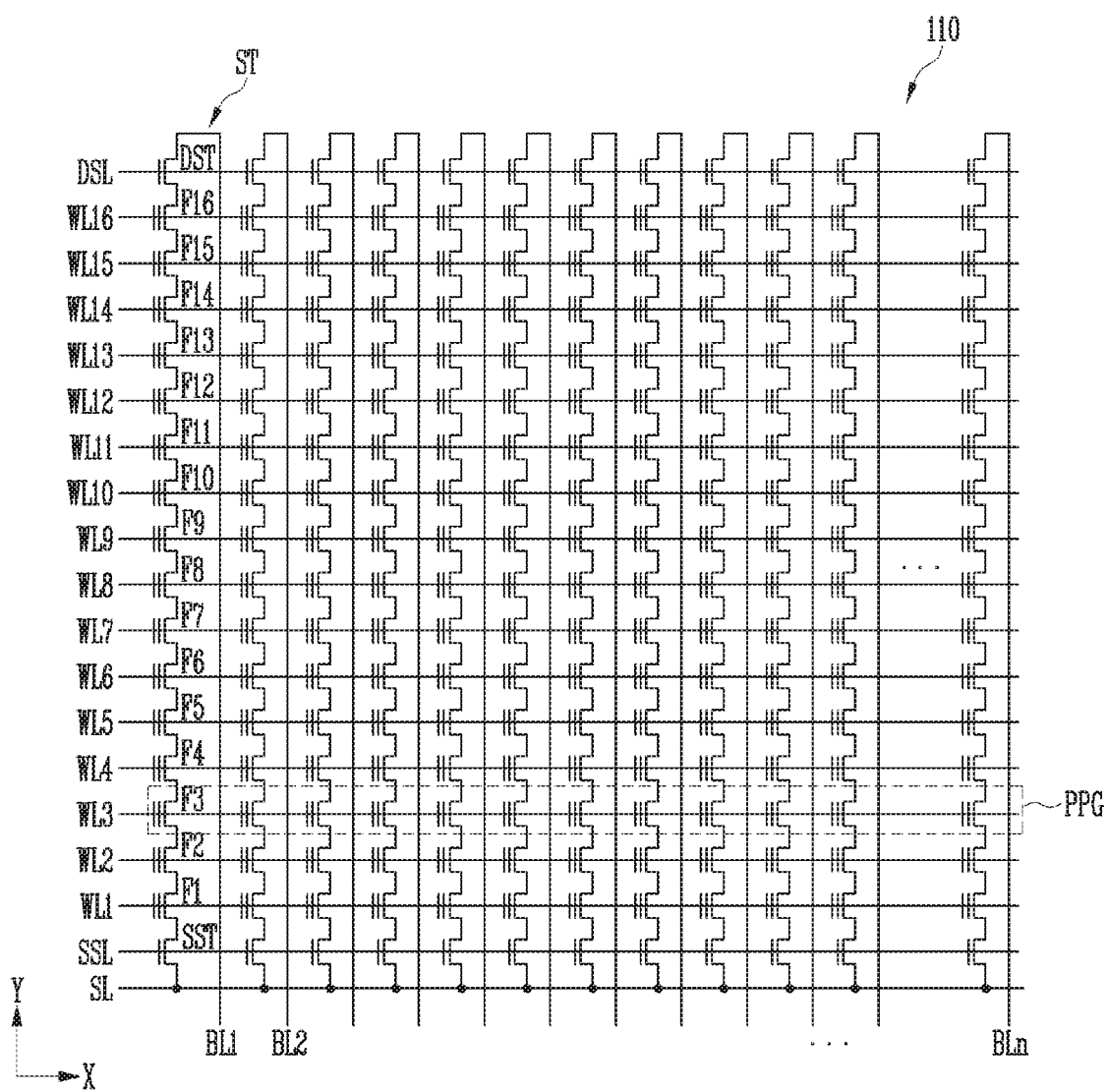
FIG. 3 shows a diagram illustrating a memory block of FIG. 2.

FIG. 3 shows a diagram illustrating a memory block of FIG. 2, for example, the first memory block (MB1) 110.

Referring to FIG. 3, a plurality of word lines WL1 to WL16 arranged parallel to one another between a first select line and a second select line may be coupled to the first memory block 110. The first select line may be a source select line SSL, and the second select line may be a drain select line DSL, More specifically, the first memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 is described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in a single string ST, and a greater number of memory cells than shown in FIG. 3 may be included in a single string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to the plurality of word lines WL1 to WL16. A group of memory cells coupled to the same word line among the memory cells included in different strings ST may be a physical page PPG. Therefore, physical pages PPG which correspond to the word lines WL1 to WL16 may be included in the first memory block 110.

One memory cell MC may store a single bit of data. This is generally called a single level cell (SLC). One physical page PPG may store one logical page (LPG) of data. The one LPG data may include a number of data bits corresponding to the number of cells included in one physical page PPG. Alternatively, one memory cell MC may store two or more bits of data. This is generally called a multi-level cell (MLC). One physical page PPG may store two or more LPGs data.

Figure 4:
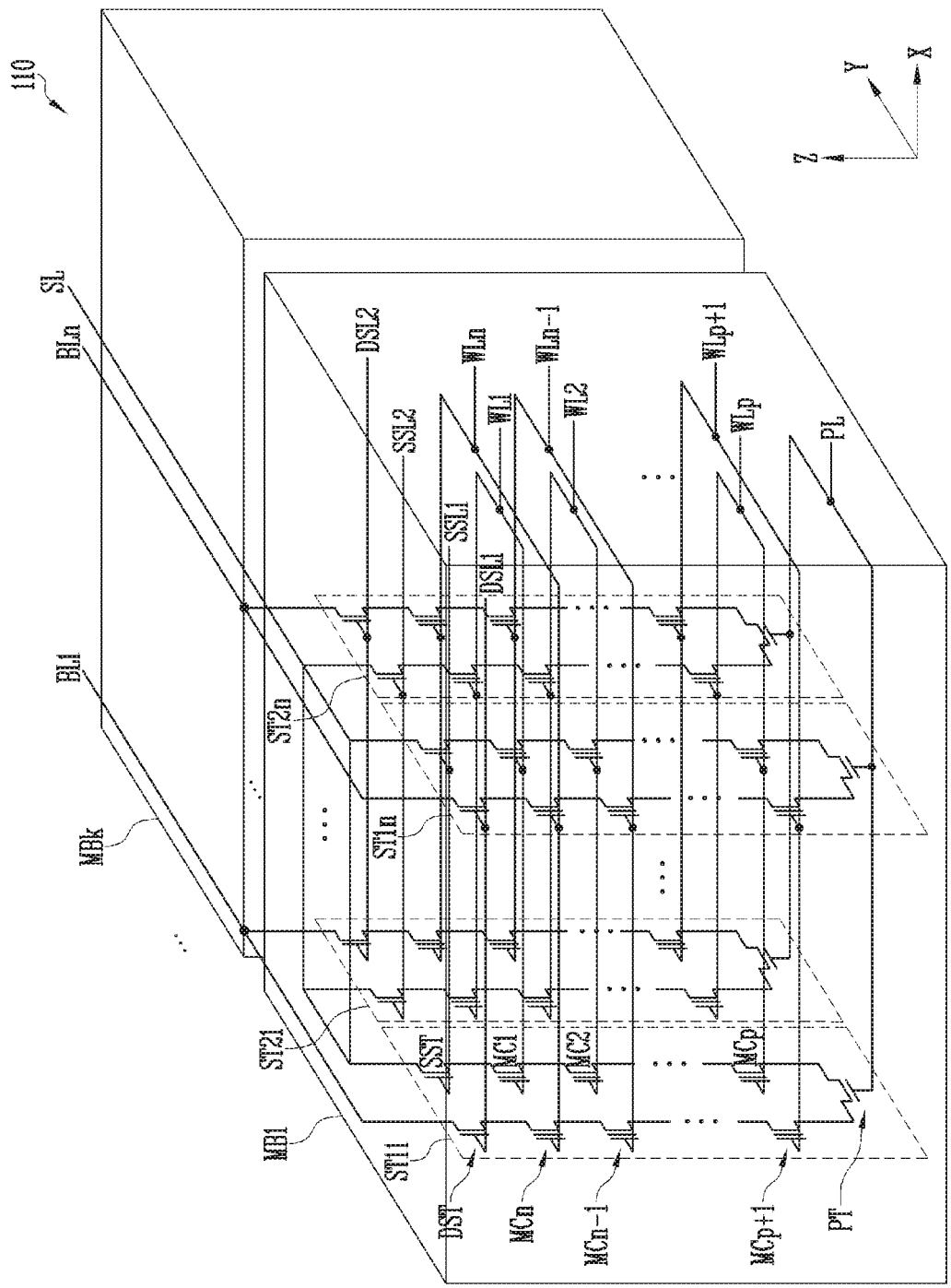
FIG. 4 shows a diagram illustrating an embodiment of a three-dimensionally configured memory block.

FIG. 4 shows a diagram illustrating an embodiment of a three-dimensionally configured memory block.

Referring to FIG. 4, the memory cell array 100 may include a plurality of memory blocks MB1 to MBk 110. Each memory block 110, for example, the first memory block MB1, may include a plurality of strings ST11 to ST1n and ST21 to ST2n. In an embodiment, each of the plurality of strings ST11 to ST1n and ST21 to ST2n may be formed in a 'U' shape. In the memory block 110, n strings may be arranged in a row direction (X direction). Although FIG. 4 illustrates that two strings are arranged in a column direction (Y direction), this is for convenience of description, and three or more strings may be arranged in the column direction (Y direction).

Each of the plurality of strings ST11 to ST1n and ST21 to ST2n may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1n of a first row may be coupled to a first source select line SSL1. Source select transistors of strings ST21 to ST2n of a second row may be coupled to a second source select line SSL2.

In another embodiment, the source select transistors of the strings ST11 to ST1n and ST21 to ST2n may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction) and coupled in series to each other between the source select transistor SST and the pipe transistor PT. The (p+1)th to nth memory cells MCp+1 to MCn may be sequentially arranged in the vertical direction (Z direction) and coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1 of the first row may be coupled to a first drain select line DSL1. Drain select transistors of the strings ST21 to ST2n of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1n and ST2n of an nth column may be coupled to an nth bit line BLn.

Memory cells coupled to the same word line among the strings arranged in the row direction may constitute one page. For example, memory cells coupled to the first word line WL1 among the strings ST11 to ST1n of the first row may constitute one page. Memory cells coupled to the first word line WL1 among the strings ST21 to ST2n of the second row may constitute another page. When any one of the drain select lines DSL1 and DSL2 is selected, strings arranged in one row direction may be selected. When any one of the word lines WL1 to WLn is selected, one page among the selected strings may be selected.

Figure 5:
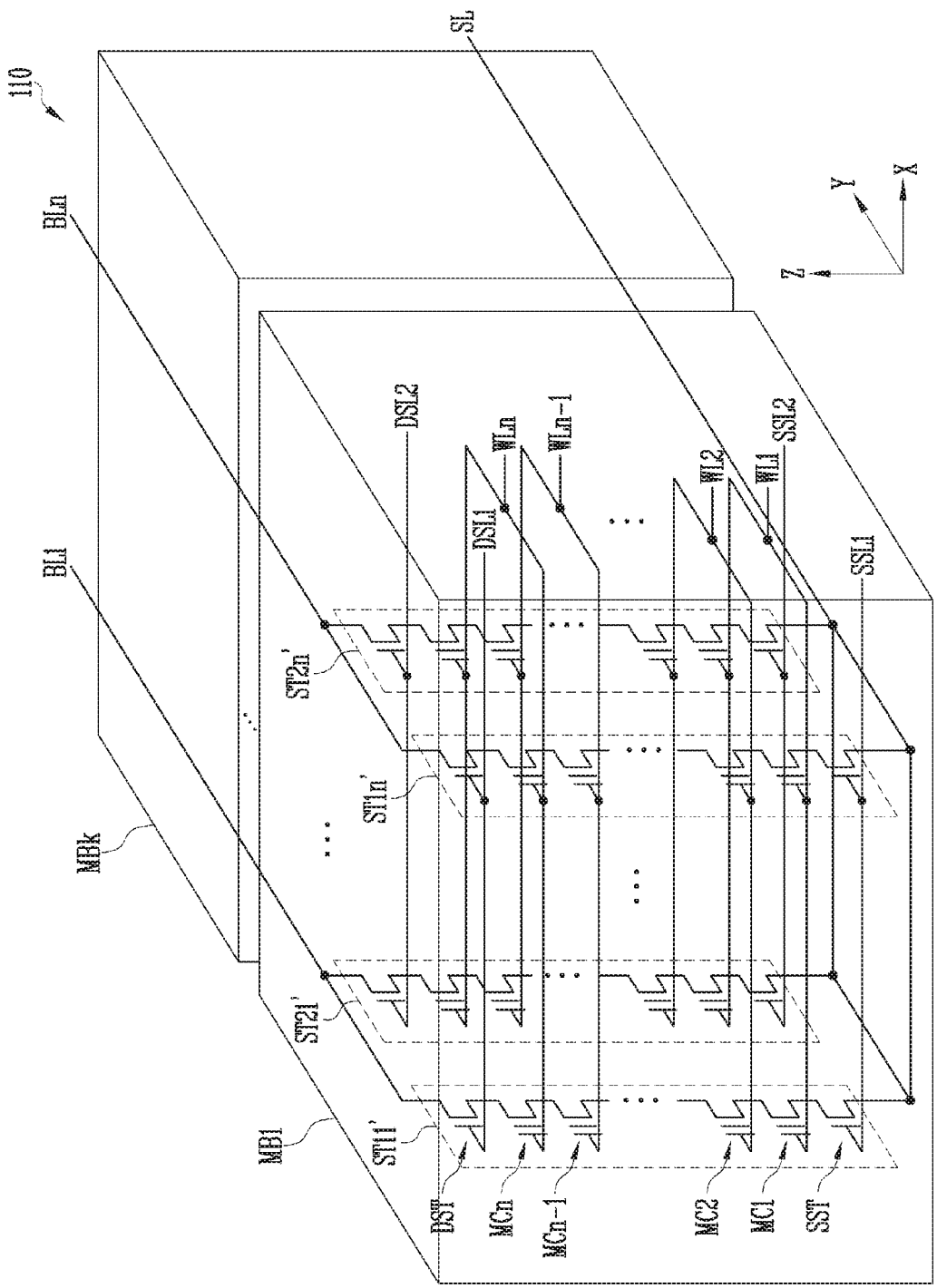
FIG. 5 shows a diagram illustrating an embodiment of a three-dimensionally configured memory block.

FIG. 5 shows a diagram illustrating another embodiment of the three-dimensionally configured memory block 110.

Referring to FIG. 5, the memory cell array 100 may include a plurality of memory blocks MB1 to MBk 110. Each memory block 110, for example, the first memory block MB1, may include a plurality of strings ST11' to ST1n' and ST21' to ST2n'. Each of the plurality of strings ST11' to ST1n' and ST21' to ST2n' may extend along a vertical direction (Z direction). In the memory block 110, n strings may be arranged in a row direction (X direction). Although FIG. 5 illustrates that two strings are arranged in a column direction (Y direction), this is for convenience of description, and three or more strings may be arranged in the column direction (Y direction).

Each of the plurality of strings ST11' to ST1n' and ST21' to ST2n' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1n' arranged on a first row may be coupled to a first source select line SSL1, Source select transistors of strings ST21' to ST2n' arranged on a second row may be coupled to a second source select line SSL2. In another embodiment, the source select transistors of the strings ST11' to ST1n' and ST21' to ST2n' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1n' of the first row may be coupled to a first drain select line DSL1. The drain select transistors DST of the strings ST21' to ST2n' of the second row may be coupled to a second drain select line DSL2.

That is, the memory block 110 of FIG. 5 may have a circuit identical to that of the memory block 110 of FIG. 4, except that the pipe transistor PT is excluded from each string.

The plurality of memory blocks MB1 to MBk 110 described in FIGS. 4 and 5 may share the source line SL.

Figure 6:
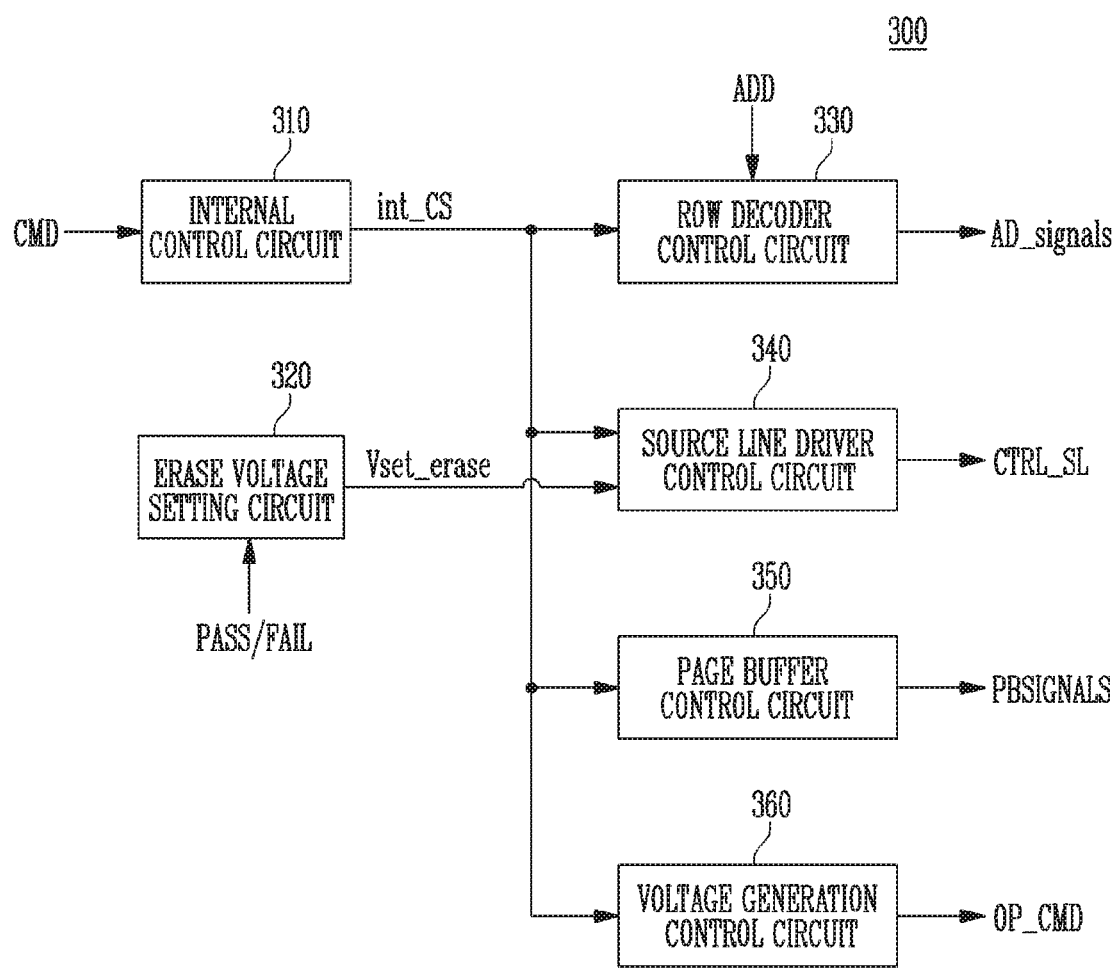
FIG. 6 shows a diagram illustrating a control logic of FIG. 2.

FIG. 6 shows a diagram illustrating the control logic 300 of FIG. 2.

Referring to FIG. 6, the control logic 300 may include an internal control circuit 310, an erase voltage setting circuit 320, a row decoder control circuit 330, a source line driver control circuit 340, a page buffer control circuit 350, and a voltage generation control circuit 360.

The internal control circuit 310 may include a read only memory (ROM). An algorithm for performing various overall operations (e.g., a program operation, a read operation, an erase operation, and the like) on the memory device may be stored in the ROM. The internal control circuit 310 generates and outputs an internal control signal int_CS in response to the command CMD.

The erase voltage setting circuit 320 stores an initial erase voltage value, and resets the initial erase voltage value by increasing or decreasing the initial erase voltage value in response to a pass/fail signal PASS/FAIL. Also, the erase voltage setting circuit 320 generates and outputs an erase voltage control signal Vset_erase according to the initial erase voltage value.

The row decoder control circuit 330 receives the address ADD and generates and outputs the row decoder control signals AD_signals for controlling the row decoder 220 of FIG. 2 in response to the internal control signal int_CS output from the internal control circuit 310. For an embodiment, the row decoder control signals AD_signals are signals for controlling the row decoder 220 of FIG. 2 to selectively apply operating voltages (e.g., a program voltage, a verify voltage, a pass voltage, and the like), generated by the voltage generating circuit 210 of FIG. 2, to word lines among the local lines LL.

The source line driver control circuit 340 generates and outputs the source line control signal CTRL_SL for controlling the source line driver 270 of FIG. 2 in response to the internal control signal int_CS output from the internal control circuit 310 and the erase voltage control signal Vset_erase output from the erase voltage setting circuit 320. For an embodiment, the source line control signal CTRL_SL is a signal for controlling the source line driver 270 of FIG. 2 to apply a source line voltage to the source line of the memory cell array 100.

The page buffer control circuit 350 generates and outputs the page buffer control signals PBSIGNALS for controlling the page buffer group 230 of FIG. 2 in response to the internal control signal int_CS output from the internal control circuit 310.

The voltage generation control circuit 360 generates and outputs the operating signal OP_CMD for controlling the voltage generating circuit 210 of FIG. 2 in response to the internal control signal int_CS output from the internal control circuit 310.

Figure 7:
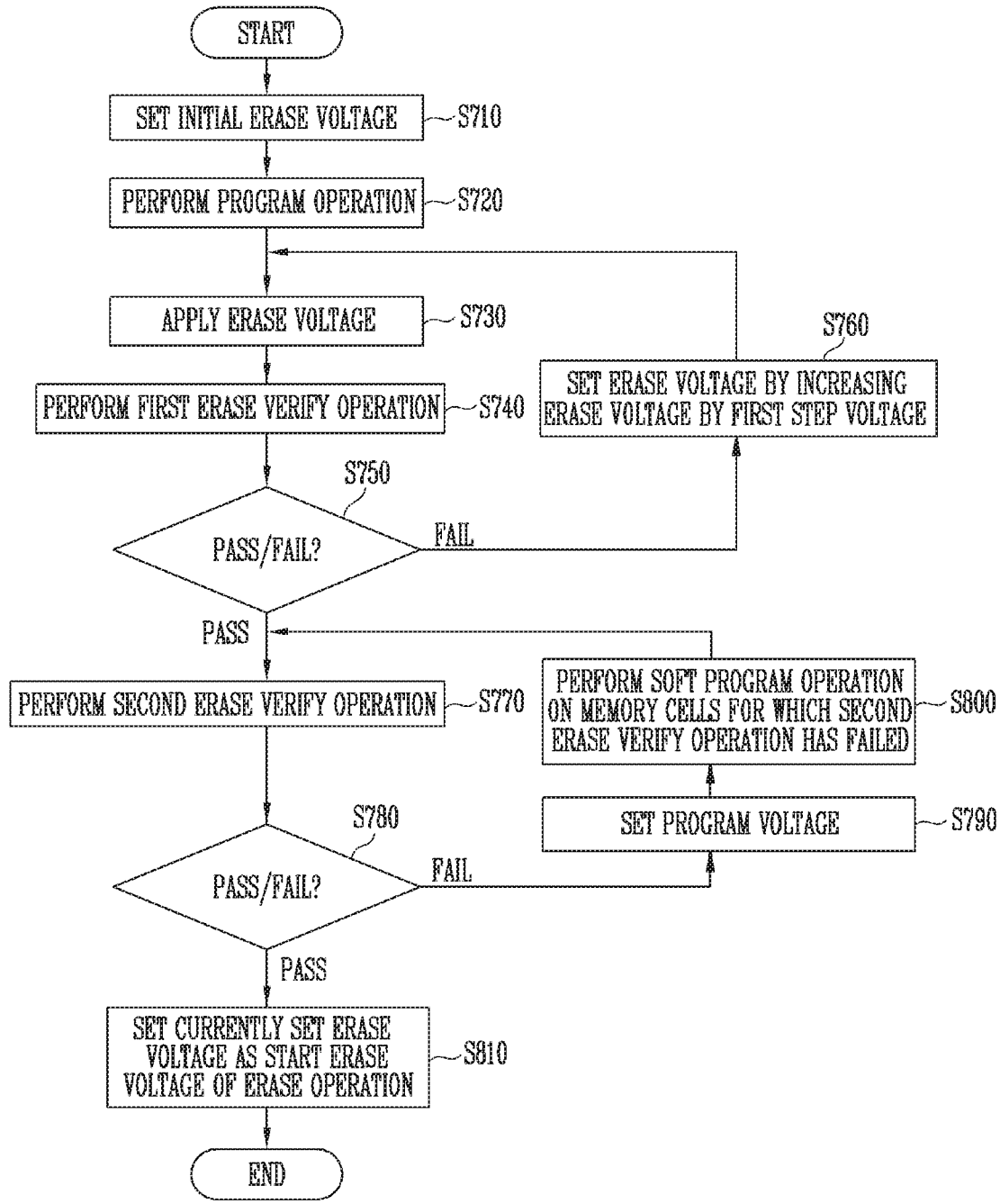
FIG. 7 shows a flowchart illustrating an operating method of a memory device, according to an embodiment of the present disclosure.

FIG. 7 shows a flowchart illustrating an operating method of the memory device 1100, according to an embodiment of the present disclosure.

Figure 8A:
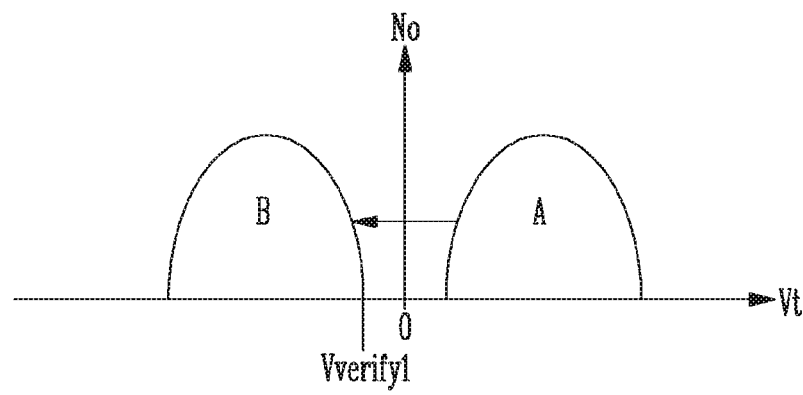
FIGS. 8A, 8B, and 8C show diagrams illustrating a threshold voltage distribution of memory cells in an erase operation, according to an embodiment of the present disclosure.
Figure 8B:
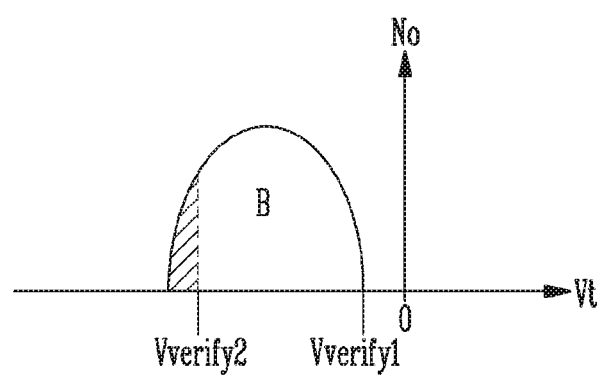
Figure 8C:
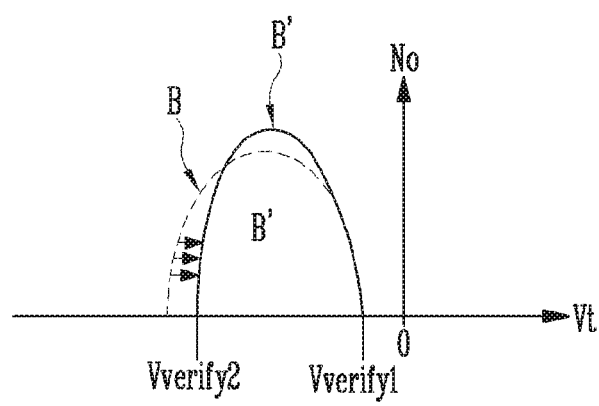

FIGS. 8A, 8B, and 8C show diagrams illustrating a threshold voltage distribution of memory cells in an erase operation, according to an embodiment of the present disclosure. Threshold voltage (Vt) is shown on the horizontal axis, and number of memory cells (No) is shown on the vertical axis.

The operating method of the memory device 1100 is described with reference to FIGS. 1 to 8C.

The control logic 300 of the memory device 1100 sets an initial erase voltage and stores the set initial erase voltage in the erase voltage setting circuit 320 (S710). The initial erase voltage may be set by the memory controller 1200 to be stored in the erase voltage setting circuit 320.

The memory device 1100 performs a program operation on a selected memory block (e.g., MB1) among a plurality of memory blocks MB1 to MBk 110 (k is a positive integer) (S720). The program operation may be a dummy program operation. The dummy program operation may be an operation of programming dummy data in the selected memory block MB1.

The control logic 300 controls the peripheral circuit 200 to perform an erase voltage application operation according to an initial erase voltage set with respect to a source line of the selected memory block MB1 (S730).

The erase voltage application operation (S730) is described in detail as follows.

The source line driver 270 generates an erase voltage in response to the source line control signal CTRL_SL and applies the generated erase voltage to the source line SL of the memory cell array 100. The row decoder 220 controls the word lines WL1 to WLn of the selected memory block MB1 to be in a floating state and applies a select line voltage (e.g., a ground voltage) to each of the drain select line DSL and the source select line SSL. Therefore, a gate induced drain leakage (GIDL) current is generated at a lower channel of the source select transistor SST of the selected memory block MB1 by the erase voltage applied through the source line SL, and hot holes generated by the GIDL current are supplied to a channel layer of a plurality of strings. Subsequently, when the row decoder 220 discharges the potential level of the word lines WL1 to WLn to a ground voltage level, the voltage difference between the word lines WL1 and WLn and a channel of the strings included in the selected memory block MB1 sufficiently increases so electrons trapped in a charge storage layer of the memory cells MC1 to MCn included in the selected memory block MB1 are discharged to the channel, and thus, the threshold voltage of the memory cells is decreased. That is, as shown in FIG. 8A, the memory cells of the selected memory block MB1 has threshold voltage distribution B in which the threshold voltage distribution of the memory cells of the selected memory block MB1 is decreased and erased from threshold voltage distribution A.

In an embodiment of the present disclosure, an erase operation using a GIDL scheme is described as an example. However, the present disclosure is not limited thereto, and the erase operation may be applied to all erase operations for erasing memory cells of the memory device. For example, the erase operation may be applied to an erase operation for erasing data stored in memory cells, using an FN tunneling scheme, by applying an erase voltage having a high-potential level to the source line.

Subsequently, a first erase verify operation is performed (S740). In the first erase verify operation, the voltage generating circuit 210 generates a first erase verify voltage Vverify1, and the row decoder 220 applies the first erase verify voltage Vverify1 to the word lines WL1 to WLn of the selected memory block MB1. The page buffer group 230 generates sensing voltage VPB by sensing a potential level or current amount of the bit lines BL1 to BLn. The pass/fail check circuit 260 outputs a pass signal PASS or a fail signal FAIL by comparing the sensing voltage VPB received from the page buffer group 230 and a reference voltage generated by a reference current. For example, when all the memory cells or a set number or more of memory cells of the selected memory block MB1 are erased with a threshold voltage lower than the first erase verify voltage Vverify1, the pass/fail check circuit 260 determines that the first erase verify operation has passed, and outputs the pass signal PASS. When a least one memory cell or a set number or more of memory cells are erased with a threshold voltage higher than the first erase verify voltage Vverify1, the pass/fail check circuit 260 determines that the first erase verify operation has failed, and output the fail signal FAIL. That is, the pass/fail check circuit 260 outputs the pass signal PASS or the fail signal FAIL by comparing the sensing voltage VPB received from the page buffer group 230 and a reference voltage corresponding to the at least one memory cell or the set number or more of memory cells.

The control logic 300 determines a result of the first erase verify operation, based on the pass signal PASS or the fail signal FAIL, which is received from the pass/fail check circuit 260 (S750).

When it is determined that the first erase verify operation has failed as the result of the first erase verify operation, the control logic 300 sets a new erase voltage by increasing the erase voltage used in the erase voltage application operation (S730) by a step voltage (S760), and again performs the above-described operations from the erase voltage application operation (S730). For example, the step voltage may be 0.4 V.

When it is determined that the first erase verify operation has passed (S770), a second erase verify operation is performed (S770). The second erase verify operation may use a second erase verify voltage Vverify2 lower than the first erase verify voltage Vverify1. The second erase verify operation may be performed in the unit of a plurality of physical pages PPG included in the selected memory block MB1.

In the second erase verify operation, the voltage generating circuit 210 generates the second erase verify voltage Vverify2, and the row decoder 220 applies the second erase verify voltage Vverify2 to a selected word line (e.g., WL1) of the selected memory block MB1. The page buffer group 230 generates sensing voltage VPB by sensing a potential level or current amount of the bit lines BL1 to BLn. The pass/fail check circuit 260 outputs the pass signal PASS or the fail signal FAIL by comparing the sensing voltage VPB received from the page buffer group 230 and the reference voltage generated by the reference current. For example, when all the memory cells of the selected memory block MB1 have a threshold voltage higher than the second erase verify voltage Vverify2, the pass/fail check circuit 260 determines that the second erase verify operation has passed, and outputs the pass signal PASS. When at least one memory cell of the selected memory block MB1 has a threshold voltage lower than the second erase verify voltage Vverify2, the pass/fail check circuit 260 determines that the second erase verify operation has failed, and outputs the fail signal FAIL. This is illustrated in FIG. 8B by a portion of the distribution being to the left of the second erase verify voltage Vverify2.

The control logic 300 determines a result of the second erase verify operation, based on the pass signal PASS or the fail signal FAIL, which is received from the pass/fail determiner 260 (S780).

When it is determined (S780) that the second erase verify operation has failed, the control logic 300 sets a program voltage (S790), and increases the threshold voltage of memory cells for which the second erase verify operation has failed among memory cells included in a selected physical page PPG by performing a soft program operation on the memory cells for which second erase verify operation has failed, using the set program voltage (S800). In the soft program operation, the control logic 300 prevents the threshold voltage of memory cells for which the second erase verify operation has passed from being increased by applying a program inhibit voltage to a bit line coupled to the memory cells for which second erase verify operation has passed. The above-described program voltage setting step (S790) may set a new program voltage by increasing the last used program voltage by a step voltage when the soft program operation (S800) is repeatedly performed, and the step voltage may be varied depending on the selected physical page PPG. For example, a page (e.g., a physical page coupled to WL1 of FIG. 5) close to a semiconductor substrate and a page (e.g., a physical page coupled to WLn of FIG. 5) distant from the semiconductor substrate may correspond to different step voltages, and a step voltage value may increase or decrease when a physical page comes close to the semiconductor substrate.

Subsequently, the control logic 300 again performs the above-described operations from the second erase verify operation (S770).

As described above, when the second erase verify operation (S770) is again performed after the soft program operation (S800), the soft program operation is repeatedly perform several times, based on the result of the second erase verify operation (S770), and therefore, an operation time may be increased. Accordingly, when it is determined (S780) that the second erase verify operation has been failed, the control logic 300 may perform the soft program operation up to a set number of times (e.g., once), skip the second erase operation, and perform step S810.

When it is determined (S780) that the second erase verify operation has passed, the control logic 300 may perform the above-described operations from the second erase verify operation (S770) by selecting a next physical page of a currently selected physical page. When it is determined (S780) that the second erase verify operation on all physical pages has been passed, the control logic 300 sets a currently set erase voltage (also referred to as the last set erase voltage) as a start erase voltage of the erase operation (S810). The start erase voltage is an erase voltage initially applied in the erase operation using an incremental step pulse erase (ISPE) of the memory device.

As described above, according to embodiments of the present disclosure, memory cells are erased to a threshold voltage distribution lower than the first erase verify voltage after a selected memory block of the memory device is dummy-programmed. Memory cells having a threshold voltage lower than the second erase verify voltage among the erased memory cells are soft-programmed such that the width of the threshold voltage distribution is narrowed, and an erase voltage is reset by increasing the erase voltage by a step voltage whenever the first erase verify operation fails. This allows an optimum or improved erase start voltage to be set in the erase operation of the memory device. FIG. 8C shows the narrowing of the threshold voltage distribution as a result of the soft programming.

Figure 9:
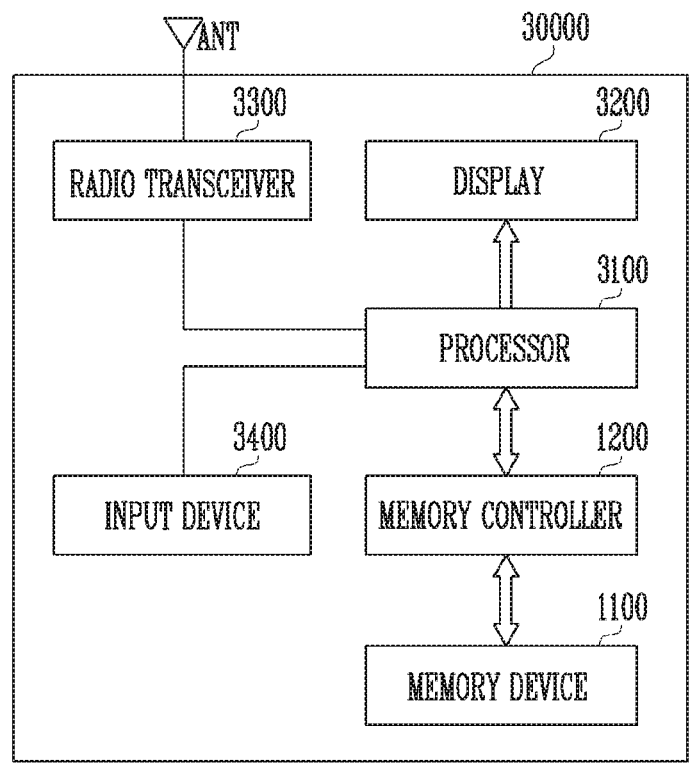
FIG. 9 shows a diagram illustrating an embodiment of the memory system including the memory device of FIG. 2.

FIG. 9 shows a diagram illustrating an embodiment of a memory system 30000 including the memory device 1100 of FIG. 2.

Referring to FIG. 9, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 10:
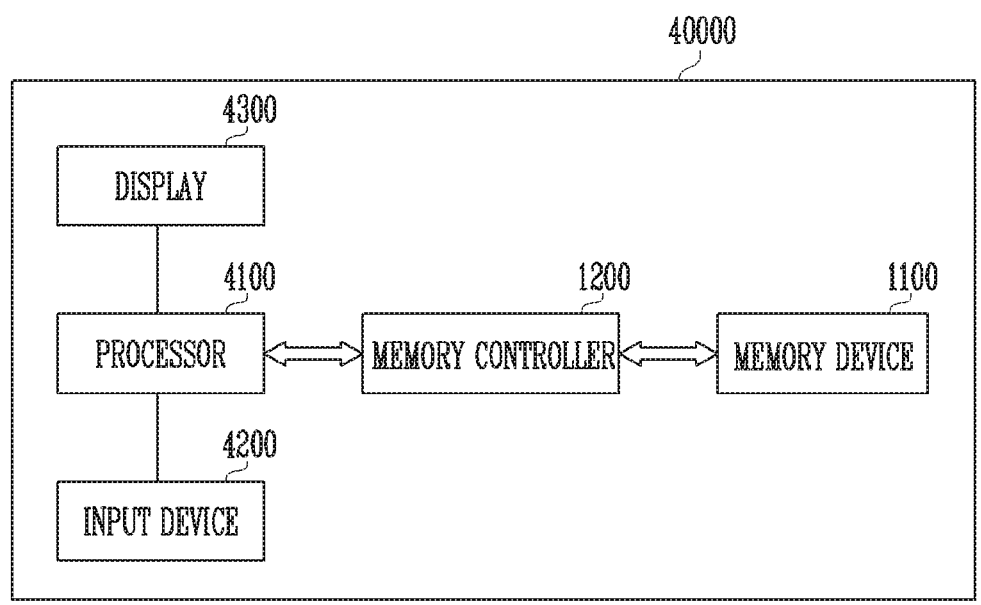
FIG. 10 shows a diagram illustrating another embodiment of a memory system including the memory device of FIG. 2.

FIG. 10 shows a diagram illustrating another embodiment of a memory system 40000 including the memory device 1100 of FIG. 2.

Referring to FIG. 10, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 11:
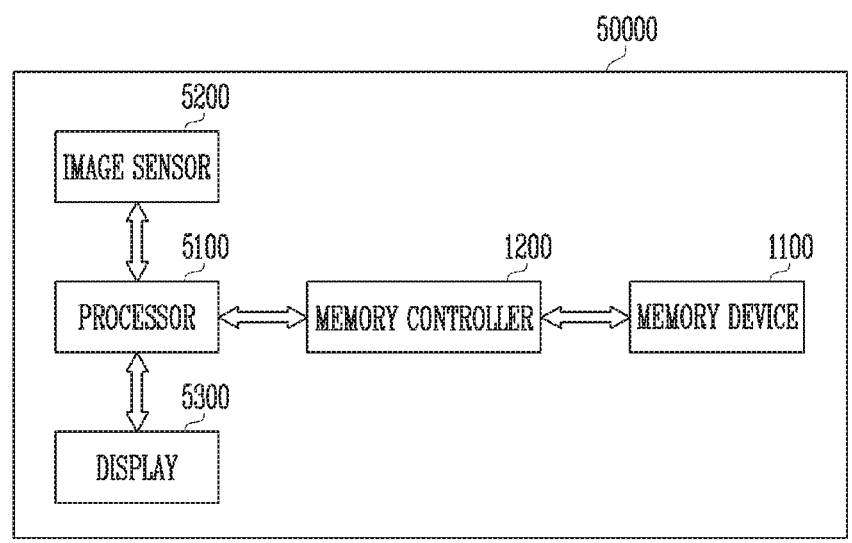
FIG. 11 shows a diagram illustrating an embodiment of a memory system including the memory device of FIG. 2.

FIG. 11 shows a diagram illustrating another embodiment of a memory system 50000 including the memory device 1100 of FIG. 2.

Referring to FIG. 11, the memory system 50000 may be implemented as an image processing device, e.g., a digital camera, a mobile terminal having an attached digital camera, a smart phone having an attached digital camera, or a tablet PC having an attached digital camera.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 12:
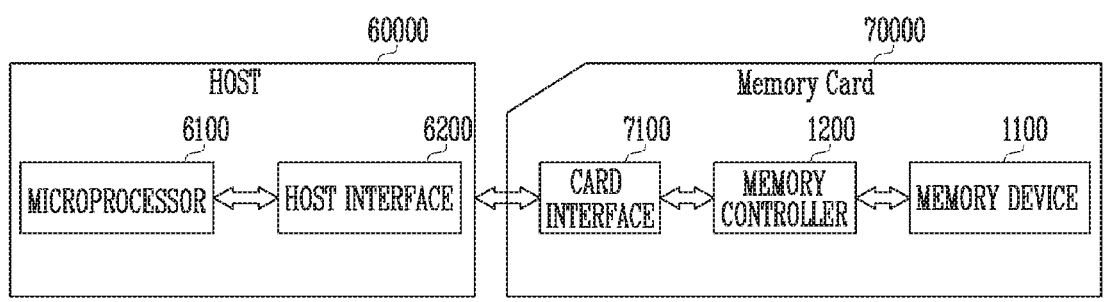
FIG. 12 shows a diagram illustrating an embodiment of a memory system including the memory device of FIG. 2.

FIG. 12 shows a diagram illustrating another embodiment of a memory system 70000 including the memory device 1100 of FIG. 2.

Referring to FIG. 12, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to the present disclosure, some memory cells of which threshold voltage distribution is low in an erase operation of the memory device are soft-programmed, thereby improving the threshold voltage distribution.

Embodiments for the present disclosure have been presented in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method for operating a memory device, the method comprising:
    performing an erase voltage application operation of erasing memory cells by applying an erase voltage to a source line of a memory block;
    performing a first erase verify operation of determining whether a threshold voltage of the memory cells is lower than a first erase verify voltage;
    when it is determined that the first erase verify operation of the memory blocks has been passed, performing a second erase verify operation of determining whether the threshold voltage of the memory cells is higher than a second erase verify voltage; and
    when it is determined that the second erase verify operation of the memory cells has been passed, setting a last reset erase voltage as a start erase voltage,
    wherein the first erase verify operation is performed in a unit of a plurality of memory blocks and the second verify operation is performed in a unit of a plurality of physical pages.

2. The method of claim 1, further comprising resetting the erase voltage by increasing the erase voltage by a step voltage and again performing the first erase verify operation when it is determined that the first erase verify operation of the memory blocks has been failed.

3. The method of claim 1, further comprising performing a soft program operation on the memory block when it is determined that the second erase verify operation of the memory cells has been failed, and then again performing the second erase verify operation.

4. The method of claim 3, wherein the soft program operation is performed in the unit of the plurality of physical pages included in the memory block.

5. The method of claim 4, further comprising setting a program voltage used in the soft program operation after the second erase verify operation is performed,
    wherein, in the setting of the program voltage, a previous program voltage is increased by a program step voltage,
    wherein the program step voltage is changed depending on a positions of the plurality of physical pages included in the memory block.

6. The method of claim 1, wherein the first erase verify voltage is higher than the second erase verify voltage.

* * * * *

UNITED STATES PATENT AND TRADEMARK OFFICE
CERTIFICATE OF CORRECTION

PATENT NO. : 10,991,439 B2
APPLICATION NO. : 17/085823
DATED : April 27, 2021
INVENTOR(S) : Yong Han and Jun Hyuk Lee Page 1 of 1

It is certified that error appears in the above-identified patent and that said Letters Patent is hereby corrected as shown below:

In the Claims

In Column 16, Line 40, Claim 5, "on a positions" should read "on positions".

Signed and Sealed this
Tenth Day of August, 2021

Drew Hirshfeld
*Performing the Functions and Duties of the
Under Secretary of Commerce for Intellectual Property and
Director of the United States Patent and Trademark Office*